(12) United States Patent
Hong et al.

(10) Patent No.: US 6,946,397 B2
(45) Date of Patent: Sep. 20, 2005

(54) CHEMICAL MECHANICAL POLISHING PROCESS WITH REDUCED DEFECTS IN A COPPER PROCESS

(75) Inventors: William Hong, Taipei (TW); Chia-Che Chung, Tainan (TW); Chi-Wei Chung, Yunlin (TW); Wen-Chih Chiou, Miaoli (TW); Ying-Ho Chen, Taipei (TW); Syun-Ming Jang, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 10/714,985

(22) Filed: Nov. 17, 2003

(65) Prior Publication Data

US 2005/0106872 A1 May 19, 2005

(51) Int. Cl.$^7$ ............................................. H01L 21/302
(52) U.S. Cl. ....................... 438/689; 438/633; 438/687; 438/691; 438/692
(58) Field of Search ................................ 438/687, 626, 438/631, 633, 690–693

(56) References Cited

U.S. PATENT DOCUMENTS

| | | | |
|---|---|---|---|
| 6,153,526 A | 11/2000 | Shih et al. | 438/692 |
| 6,395,635 B1 | 5/2002 | Wang et al. | 438/692 |
| 6,432,826 B1 | 8/2002 | Emami et al. | 438/692 |
| 6,503,828 B1 | 1/2003 | Nagahara et al. | 438/633 |
| 6,620,027 B2 * | 9/2003 | Zutshi et al. | 451/5 |
| 2003/0013306 A1 * | 1/2003 | Tsai et al. | 438/692 |

OTHER PUBLICATIONS

Co–pending U.S. Appl. No. 10/723,236, filed Nov. 26, 2003, same assignee, "An Advanced Process Control Approach for Cu Interconnect Wiring Sheet Resistance Control".
Co–pending U.S. Appl. No. 10/627,795, filed Jul. 25, 2003, same assignee, "Barrier–Slurry–Free Copper CMP Process".

* cited by examiner

Primary Examiner—Thanh Nguyen
(74) Attorney, Agent, or Firm—Haynes and Boone, LLP

(57) ABSTRACT

An oxide polishing process that is part of a CMP process flow is disclosed. After a copper layer is polished at a first polishing station and a diffusion barrier layer is polished at a second polishing station, a key sequence at a third polish station is the application of a first oxide slurry and a first DI water rinse followed by a second oxide slurry and then a second DI water rinse. As a result, defect counts are reduced from several thousand to less than 100. Another important factor is a low down force that enables more efficient particle removal. The improved oxide polishing process has the same throughput as a single oxide polish and a DI water rinse method and may be implemented in any three slurry copper CMP process flow.

24 Claims, 4 Drawing Sheets

FIG. 1 – Prior Art

CHEMICAL MECHANICAL POLISHING PROCESS WITH REDUCED DEFECTS IN A COPPER PROCESS

RELATED PATENT APPLICATION

This application is related to U.S. patent Ser. No. 10/723,236, filing date Nov. 26, 2003, and to Ser. No. 10/627,795, filing date Jul. 25, 2003; assigned to a common assignee.

FIELD OF THE INVENTION

The invention relates to the field of fabricating high speed integrated circuits and in particular to a method of reducing the number of defects on a substrate following a chemical mechanical polishing (CMP) step of a copper interconnect structure.

BACKGROUND OF THE INVENTION

The use of copper wiring as interconnects in semiconductor devices has increased dramatically as ground rules shrink in order to reduce resistivity in the metal wiring. Interconnects are typically formed by a damascene approach in which a metal is deposited in an opening etched into one or more dielectric layers on a substrate. Although copper has a lower resistivity than Al or W, copper has a higher tendency to migrate into a dielectric layer. Therefore, a diffusion barrier layer such as Ta, TaN, Ti, or TiN is generally deposited on the sidewalls and bottom of an opening before depositing a copper layer. An important aspect of the damascene process is planarization of the metal and diffusion barrier layers so that they are coplanar with the top dielectric layer which is typically an interlevel dielectric layer (ILD). A CMP process is frequently employed as the preferred method to achieve planarization and involves a mechanical abrasive action as well as a chemical (etching) action. A CMP process may involve more than one CMP step. For example, a first CMP step may be used to substantially lower the level of the copper layer and then a second CMP step may be applied to remove the diffusion barrier layer above the dielectric layer. Finally, a third buffing step is commonly employed to reduce the amount of scratches on the substrate surface and improve planarity.

An example of a commercially available CMP tool is represented by tool 1 in FIG. 1. Tool 1 includes an upper carousel 2 that can rotate about a center post 3 on a center axis 4. Carousel 2 contains four rotatable carrier heads 5 that each holds a wafer 6. The base 7 of the CMP tool 1 is comprised of three polishing stations 8 and a transfer station 9. Each polishing station 8 has a rotatable platen 10 upon which a polishing pad 11 is placed and a mechanism for introducing a chemical slurry (not shown) that aids the polishing process. Typically, a wafer 6 is pressed against a polishing pad and slurry while the head 5 is rotated in one direction and the platen 9 is rotated in the opposite direction. Other solutions such as a deionized (DI) water rinse can be applied to the pad to remove the slurry before the wafer is transferred to another station. Other parts of the CMP tool 1 are not shown and may include an end point detect system to prevent excessive polishing of a metal or dielectric layer.

The CMP process has been improved by implementing methods to avoid defects such as scratches on the surface of the metal or dielectric layers, dishing, and copper corrosion. For example, corrosion is greatly reduced by treating the wafer including an exposed copper layer with an inhibitor solution containing benzotriazole (BTA) or the like. A method to prevent dishing is described in U.S. Pat. No. 6,503,828 and involves a polishing barrier layer that is formed over a copper layer and is patterned to protect the portion of the copper layer that is within a via or trench.

The number of particle or residue defects on a wafer after a conventional CMP buffing step remains a serious issue since the defects may reduce device yield and performance and lower reliability. These defects are comprised of particles or residues remaining from one or more slurries, particles or residues from the Cu or diffusion barrier layer, or a by-product of the chemical action between the slurry and one of the polished layers. In many cases the particle count is several thousand as determined by inspection with a defect monitor tool such as one available from Tencor, KLA, or Applied Materials.

In U.S. Pat. No. 6,395,635, a three step CMP process is followed by a two step buffing procedure applied to a dielectric layer to reduce residue and scratch defects on a tungsten damascene structure. The buffing procedure includes an oxide slurry followed by a DI water rinse and lowers the number of measured imperfections by about 50%.

Another method for removing residue in a tungsten CMP process is provided in U.S. Pat. No. 6,153,526 where a first tungsten CMP step is performed with a hard pad, a second oxide buffing step uses a soft pad, and a third short W CMP step involves a soft polishing pad. The third step is credited with removing oxide particles. A planarizing method for copper with reduced defects is disclosed in U.S. Pat. No. 6,432,826 where a first CMP step is performed to substantially lower the level of a copper layer, a buffing step is used to remove a diffusion barrier layer above an ILD, and a second buffing step is employed for a partial defect reduction. A final step that further lowers the defect count of stains and defects is treatment with a water solution containing citric acid, $NH_4OH$, and optionally, a BTA corrosion inhibitor that removes about a 100 Angstroms thickness from the Cu surface and from the dielectric layer.

Existing oxide buffing processes are not effective in reducing particle and residue defects below a specified level that guarantees good device performance, especially for technology nodes approaching 100 nm and below. Therefore, a CMP procedure involving an improved oxide buffing process is required to achieve the low defect counts that are needed for advanced technologies.

SUMMARY OF THE INVENTION

An objective of the present invention is to reduce the number of particle defects on a substrate following an oxide buffing process.

A further objective of the present invention is to implement a second oxide slurry polish and an additional DI water polish and rinse step in a copper CMP buffing process without lowering throughput.

These objectives are achieved with a CMP sequence that includes a first copper CMP step that substantially lowers the level of a copper layer on a substrate, a second CMP step that polishes an adjacent diffusion barrier layer, and an oxide buffing process that has a first oxide slurry which is followed by a first DI water polish and rinse and then a second oxide slurry followed by a second DI water polish and rinse.

The CMP sequence is implemented as part of a interconnect fabrication scheme in which an opening is formed in a stack comprised of an upper dielectric layer that is preferably a low k dielectric material and a lower etch stop layer on a substrate. In one embodiment, the opening is a contact hole that makes a connection to an underlying conductive layer such as a source/drain region in a transistor. In another embodiment, the opening may be a dual damascene structure in which a trench is formed above a via and the via forms an electrical connection through a diffusion barrier layer to an underlying metal layer. The opening is formed by conventional patterning and etching techniques and in newer technologies may be 100 nm or smaller in width. A diffusion barrier layer that is preferably TaN is conformally deposited on the sidewalls and bottom of the opening. A copper layer is deposited on the diffusion barrier layer by an electrochemical deposition or by another well known method.

At this point, a first copper polish step is performed on a first platen in a CMP tool that lowers the level of the copper layer until it is approximately coplanar with the diffusion barrier layer. A second polish step on a second platen is used to remove the diffusion barrier layer above the dielectric layer. A third polish step is performed on a third platen in the CMP tool and involves an oxide polish process where a first oxide slurry application is followed by a DI water rinse and then a second application of the oxide slurry is followed by a second DI water rinse. The oxide polish process is optimized so that the total time for all steps remains unchanged from a prior art method with only one oxide slurry application. Therefore, throughput is not affected. The down force of the polishing pad during DI water rinse segments of the oxide polish process is lowered compared to a prior art method and this adjustment also helps to reduce the number of particle defects produced during the oxide polish process.

In one embodiment, each step of the oxide polish process is run for a fixed period of time that does not vary from wafer to wafer as in a lot based method. In a second embodiment, the oxide polish process may be integrated with an advanced process control (APC) system that is wafer based and has feed forward and feed backward components for adjusting the polish time for each wafer on a real time basis. A wafer based APC system is able to compensate for process variations and thereby maintain sheet resistance (Rs) values for the resulting copper interconnects within specified limits.

BRIEF DESCRIPTION OF THE DRAWINGS

The features and advantages of a semiconductor process method according to the present invention will be more clearly understood from the following description taken in conjunction with the accompanying drawings in which like reference numerals designate similar or corresponding elements, regions, and portions, and in which.

DETAILED DESCRIPTION OF THE INVENTION

The present invention is especially useful in reducing the amount of particle defects formed as the result of a CMP process flow in a damascene scheme that includes three different polish processes at three different polish stations. In one embodiment, the present invention is an oxide polish process that follows a first CMP process in which a copper layer is substantially planarized and a second CMP process where a diffusion barrier layer is removed from the surface of a dielectric layer. Although the drawings depict the application of the CMP process flow to the fabrication of a copper interconnect formed in a via above an underlying metal layer, the drawings are not intended to limit the scope of the invention and other applications are possible. For example, the interconnect may also be a contact to an underlying conductive layer such as a source/drain region in a transistor. Optionally, the copper interconnect fills a trench and an underlying via in a dual damascene structure. Alternatively, more than one dielectric layer and more than one etch stop layer may be employed in a damascene scheme. Furthermore, the resulting copper interconnect structure may be part of a logic, DRAM, image sensor, MEMS, MRAM, or other semiconductor device.

Figure 1:
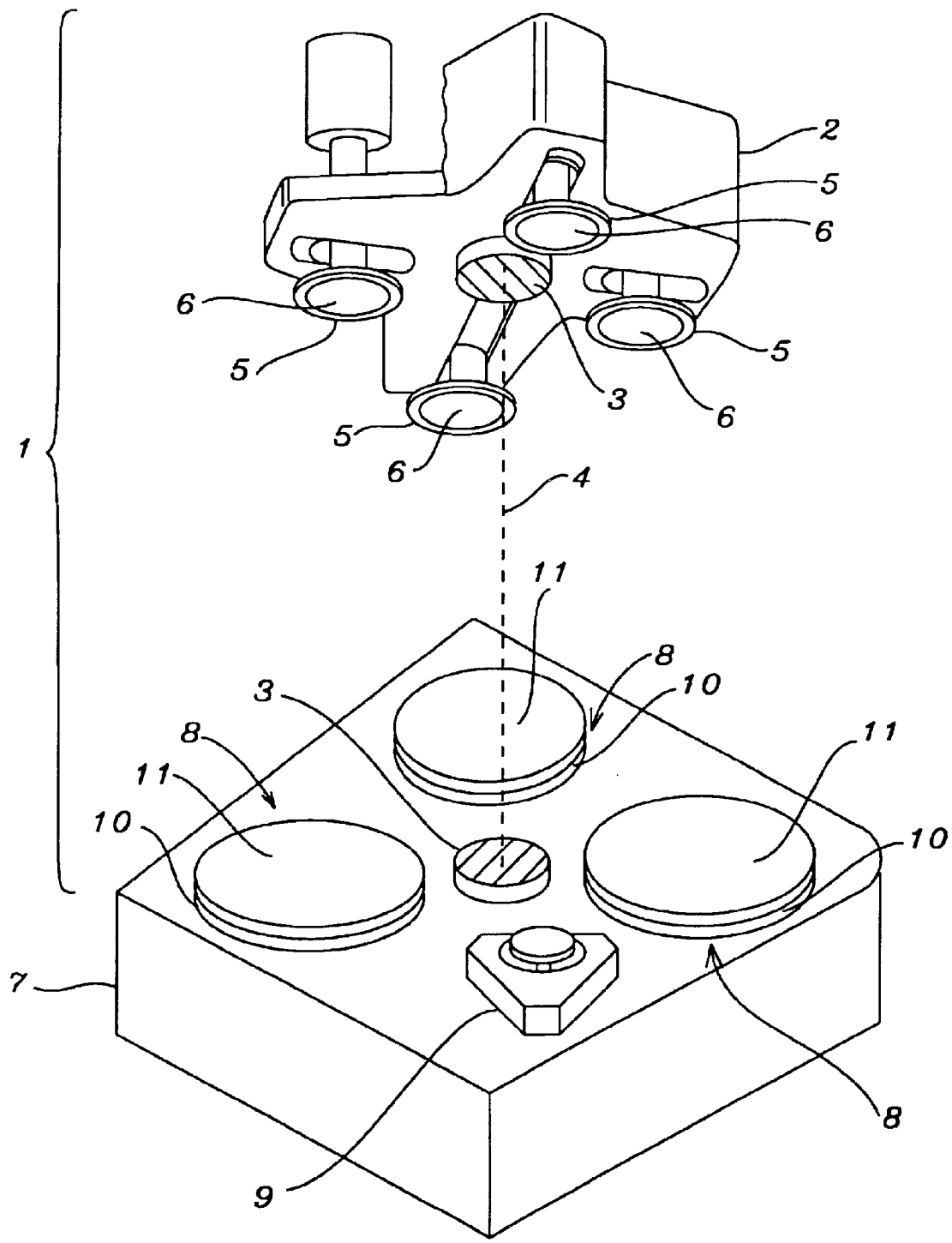
FIG. 1 illustrates a conventional CMP tool that has four carrier heads, three polishing stations and a wafer transfer station.
Figure 2:
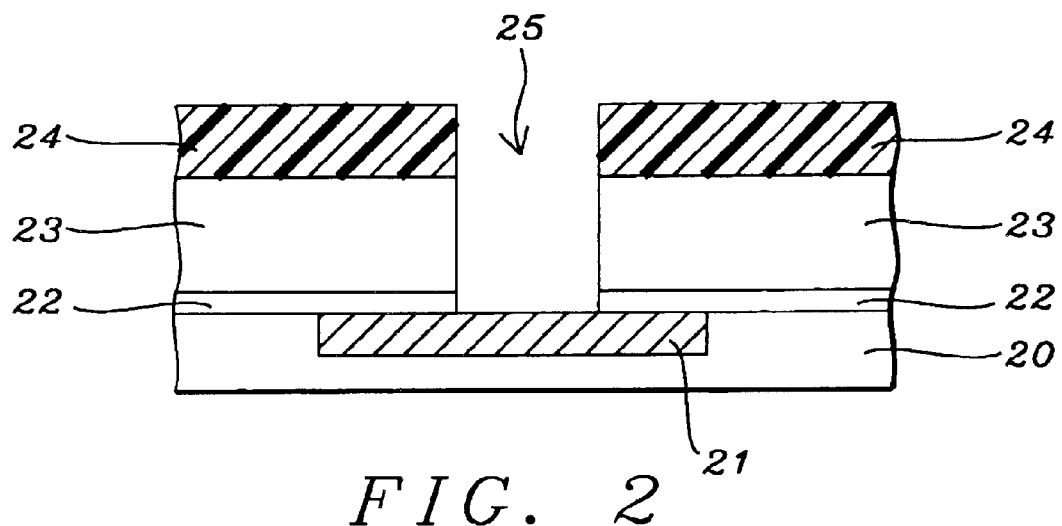
FIGS. 2–5 are cross-sectional views representing a copper interconnect fabrication sequence in which an opening is formed in a dielectric layer followed by deposition of a diffusion barrier layer and a copper layer in the opening, and then a series of CMP planarization steps is performed according to the present invention to complete the interconnect structure.

In a first embodiment shown in FIGS. 2–5, a diffusion barrier layer and a copper layer that are deposited in a via opening are planarized by a CMP process flow. Referring to FIG. 2, a substrate 20 is provided that is typically silicon but may also be based on silicon-on-insulator, Ga—As, SiGe, or other semiconductor materials used in the industry. It is understood that a substrate is typically a semiconductor wafer and the terms substrate and wafer may be used interchangeably. Substrate 20 may have active and passive devices that are not shown in order to simplify the drawing. A first metal layer 21 that is preferably copper but may also be W, Al, Al/Cu or AlSiCu is formed in substrate 20 by conventional techniques. The first metal layer 21 may be surrounded on its sides and bottom by a conformal diffusion barrier layer (not shown) that prevents metal ions from migrating into substrate 20 and protects the first metal layer 21 from components in substrate 20 that might cause corrosion or oxidation.

An etch stop layer 22 is deposited on the substrate 20 and first metal layer 21 and is preferably comprised of silicon carbide, silicon oxynitride, or silicon nitride. Next, a dielectric layer 23 that is phosphosilicate glass (PSG), borophosphosilicate glass (BPSG), silicon oxide or is preferably a low k dielectric material such as carbon doped silicon oxide, fluorine doped silicon oxide, or a polysilsesquioxane is deposited by a chemical vapor deposition (CVD), plasma enhanced CVD, or a spin-on method and has a thickness between about 2000 and 6000 Angstroms. The dielectric layer 23 may be further processed by heating at a temperature of up to 600° C. or by treating with a plasma process known to those skilled in the art to densify the layer, modify surface properties, and prevent an uptake of water that could increase the dielectric constant.

A photoresist layer 24 is coated on the dielectric layer 23 and is patterned by a conventional method to form an opening 25 that may be a via, trench, or contact hole.

Optionally, an anti-reflective coating (ARC) which is not shown is formed on the dielectric layer 23 prior to coating the photoresist layer 24 in order to improve the process latitude of the subsequent patterning step. The patterned photoresist layer 24 is used as an etch mask while the opening 25 is transferred through dielectric layer 23 and etch stop layer 22 by one or more plasma etch steps. Any remaining photoresist layer 24 and ARC are removed by a commercially available stripper solution or alternatively, by a plasma ashing. Typically, a standard cleaning process is employed to remove any organic residues remaining on the dielectric layer 23 or in the opening 25 which has a top, bottom, and sidewalls after the photoresist removal step.

Figure 3:
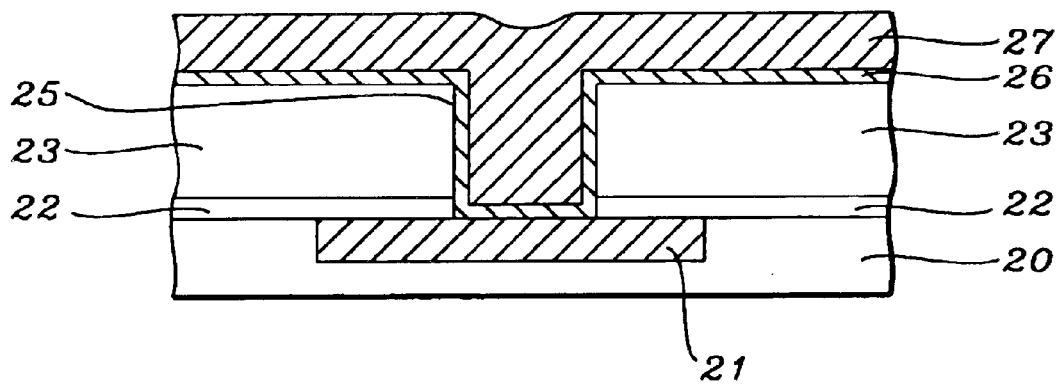

Referring to FIG. 3, a conformal diffusion barrier layer 26 is deposited by a CVD or plasma enhanced CVD method on the sidewalls and bottom of the opening 25 and on the dielectric layer 23. Optionally, when the diffusion barrier layer 26 has a thickness that is about 50 nm (500 Angstroms) or less, an atomic layer deposition (ALD) process may be used for the deposition. The diffusion barrier layer 26 is preferably TaN but may also be one or more of Ta, Ti, TiN, WN, W, TaSiN, or TiSiN. A copper layer 27 is formed on the diffusion barrier layer 26 by an electrochemical deposition or electroless plating technique, for example. The copper layer 27 fills opening 25 and extends above the diffusion barrier layer 26 by about 6000 to 13000 Angstroms.

Figure 4:
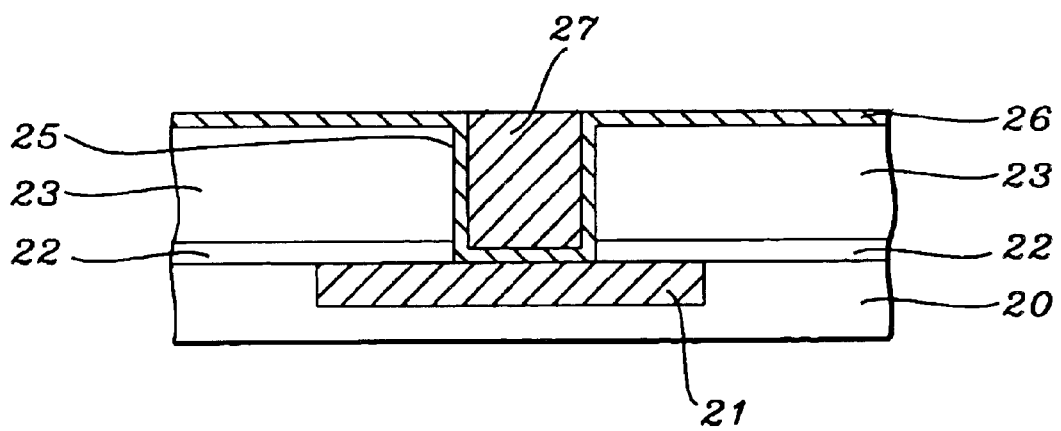

Referring to FIG. 4, a first CMP process is performed in which the copper layer 27 is removed above the diffusion barrier layer 26 and becomes essentially coplanar with the diffusion barrier layer. The first CMP process is performed on a platen at a first polishing station in a CMP tool such as a Mirra Mesa tool that is commercially available from Applied Materials. The substrate 20 has a top and bottom surface and is held by its bottom surface on a head above the first polishing station. Typically, a hard polishing pad comprised of polyurethane on a platen is used for the first CMP process and contacts the top surface of the substrate 20. The top surface of the substrate in the first CMP process is defined as the surface comprised of a copper layer area to be polished. The first CMP process includes a commercially available slurry comprised of silica, water, and one or more additives that are typically proprietary which is introduced between the substrate and the polishing pad. The slurry has a pH between about 7 and 10 and is applied at a flow rate of from 200 to 400 ml per minute at a temperature of 20° C. to 30° C. for a period of about 80 to 140 seconds. The polish pressure is from 1.5 to 6 psi with a platen rotational speed from about 70 to 130 rpm. When the diffusion barrier layer 26 is TaN, the first CMP process has a selectivity of Cu to TaN of greater than 100 to 1. Note that a small amount of the diffusion barrier layer 26 may be removed during the first CMP process that forms a polished copper layer 27.

Figure 5:
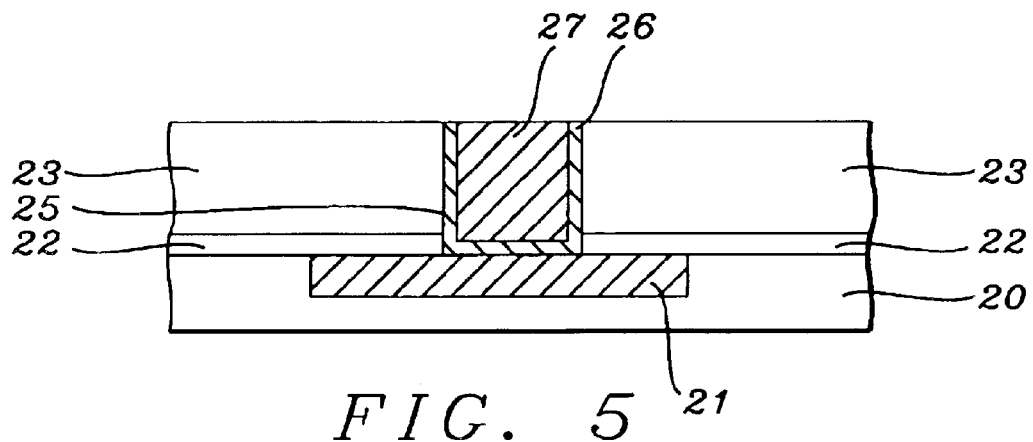

Referring to FIG. 5, a second CMP process is performed which involves polishing the diffusion barrier layer 26 on a platen at a second polish station while the bottom surface of substrate 20 is held by a second head so that the diffusion barrier layer contacts the polishing pad and is removed from above dielectric layer 23. Here the top surface of the substrate is comprised of a diffusion barrier layer area and a copper layer area to be polished. Note that the top of the polished copper layer 27 is also lowered during the second CMP process and a twice polished copper layer 27 is formed that is about coplanar with the polished diffusion barrier layer 26 and the top of the opening 25.

The second CMP process is performed on a second platen with a second polishing pad in the same CMP tool used for the first CMP process. Typically, a hard polishing pad comprised of polyurethane is used on the second platen. The second CMP process includes a second slurry comprised of silica, water, and one or more additives that are typically proprietary which is introduced between the substrate and the polishing pad. The second slurry has a pH from about 7 to 10 and is applied with a flow rate of from 200 to 400 ml per minute at a temperature of 20° C. to 30° C. for a period of about 60 to 120 seconds. The polish pressure is from 2 to 4 psi with a platen rotational speed from about 70 to 120 rpm. When the diffusion barrier layer 26 is TaN, the second CMP process has a selectivity of TaN to Cu of about 20:1 and a selectivity of TaN to the dielectric layer 23 of about 2:1. Therefore, some of the dielectric layer 23 may be removed during the second CMP process.

A key feature of the present invention is a third CMP process comprised of a sequence of steps that are collectively referred to as an oxide polish process. Once the diffusion barrier layer 26 is removed from above the dielectric layer 23, the top surface of the substrate 20 is comprised of a dielectric layer area at the top of the dielectric layer 23, a diffusion barrier layer area at the top of the polished diffusion barrier layer 26, and a copper layer area at the top of the twice polished copper layer 27. The top surface of the substrate 20 is lightly polished in order to remove scratch defects and particles caused by the previous two CMP processes and to form a smoother top surface. As described in the related application TSMC02-0992 which is herein incorporated by reference, an oxide polish process may also be used to adjust the thickness of a copper layer to bring a sheet resistance (Rs) value for the resulting copper interconnect within specification.

A prior art oxide polish method practiced by the inventors involves a first CMP step with an oxide slurry followed by DI water polish and rinse steps. However, this method typically leaves several thousand defects on a substrate as detected by a defect monitor tool such as a KLA 2350 or an AMAT Compass. The prior art method is outlined in Table 1 and includes a first step A of 20 seconds duration and a 2 psi down force with a Rodel Politex (polyurethane) soft pad and about a 300 ml/min. flow rate of an oxide slurry comprised of silica, water, and an additive. The slurry has a pH in the range of 7 to 10 and is applied at a temperature in the range of 20° C. to 30° C. The rotational speed of the platen is from about 40 to 70 rpm. During steps B to D, the flow of the slurry is stopped and a flow of DI water is directed onto the platen at a rate of 300 to 500 ml per minute. The DI water rinses the pad and the substrate while the platen continues to be rotated at about 40 rpm. Step B continues for 20 seconds with a down force of 2 psi. Step C proceeds for 15 seconds with a down force of −1 psi and step D continues for 20 seconds with a down force of 1 psi. The total time for the process is 75 seconds. It is understood that a down force of −1 psi means that the polishing head is raised slightly so that it does not touch the polishing pad.

TABLE 1

Prior Art Polish Recipe (75 sec. total)

| Step | Down Force (psi) | Flow | Time (sec.) |
| --- | --- | --- | --- |
| A | 2 | Oxide slurry | 20 |
| B | 2 | DI water | 20 |
| C | −1 | DI water | 15 |
| D | 2 | DI water | 20 |

The inventors have surprisingly discovered that an oxide polish process comprised of a first oxide slurry and a first DI water polish and rinse followed by a second oxide slurry and a second DI water polish and rinse is successful in reducing particle counts from greater than 1000 to less than 100 per wafer. The oxide polish process is performed on a platen at a third polish station while the bottom surface of the substrate 20 is held by a head in the same CMP polish tool used for the first two CMP processes. The top surface of the substrate 20 is contacted with a polishing pad and a slurry on a platen at the third polishing station.

The novel oxide polish process is outlined in Table 2 and is comprised of a step 1 in which the top surface of the substrate 20 is polished by a process involving an oxide slurry and process parameters which are the same as those described for step A in the prior art method practiced by the inventors. In step 2, a DI water rinse is applied to the substrate 20 for a 10 second period at the rate of about 500 ml/min while the platen continues to rotate at a speed of about 40 to 70 rpm and with a down force of 1 psi. Step 3 involves applying a mixture of DI water at the rate of 500 to 1000 ml/min. and the aforementioned oxide slurry at the rate of about 200 to 300 ml/min for period of 10 seconds with a down force of –1 psi. In step 4, the oxide slurry is applied at the rate of about 300 ml/min. for 15 seconds while the platen is rotated at 40 to 70 rpm and with a down force of 1 psi. In the final step, a DI water rinse is applied at the rate of about 500 ml/min. while the platen continues to rotate at a speed of about 40 to 70 rpm and with a down force of 1 psi. Although a range of down force from 1 to 3 psi is acceptable for steps 2, 4, and 5, a lighter down force of 1 psi is preferred in order to reduce the amount of defects caused by the light buffing process. Note that after the pad is cleaned with DI water in step 2, the oxide slurry/water mixture in step 3 is used to prime the polishing pad so that the polishing pad is evenly coated with slurry at the start of step 4. The wager is preferably dried after step 5 in a spin-rinse-dry module that is integrated with the CMP tool.

TABLE 2

Extra Slurry Polish Recipe (75 sec. total)

| Step | Down Force (psi) | Flow | Time (sec.) |
|---|---|---|---|
| 1 | 2 | Oxide slurry | 20 |
| 2 | 1 | DI water | 10 |
| 3 | –1 | DI water + Oxide slurry | 10 |
| 4 | 1 | Oxide slurry | 15 |
| 5 | 1 | DI water | 20 |

Total time for the oxide polish process of the present invention is 75 seconds so that wafer throughput through the CMP tool is not decreased compared with the prior art method outlined in Table 1. The oxide polish process is typically performed on a wafer on a third platen while a diffusion barrier layer on another wafer is polished on a second platen, and while a Cu layer on a third wafer is polished on a first platen as described previously. It is important to keep the process time on each of the three platens similar so as not to slow the flow of wafers through the CMP tool. This embodiment may be used for a series of wafers such as a lot of from 1 to 25 wafers which all have a similar dielectric layer, diffusion barrier layer, and copper layer thickness so that a small drift in the oxide polish process will not cause the sheet resistance (Rs) for a resulting copper interconnect to drift outside a specified range. It should be understood that the oxide polish conditions provided in Table 2 are an example of an embodiment of this invention and are not intended to limit the scope of the invention. For example, the conditions such as time and down force for various steps may be changed slightly if a different CMP tool is used or if a different slurry composition or polishing pad is employed.

Figure 6:
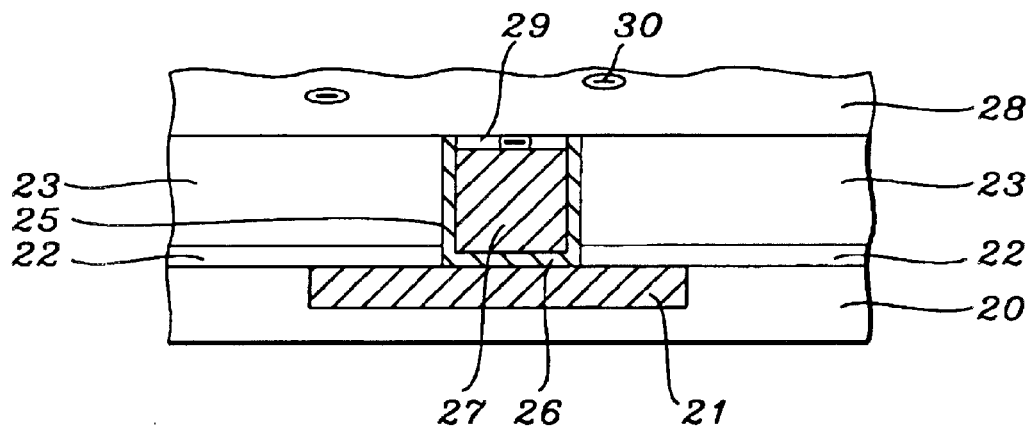
FIG. 6 is a cross-sectional view of a copper interconnect during the application of an oxide slurry and indicates a possible mechanism whereby a negative charge on a particle is repulsed by one or more negatively charged layers on a substrate.
Figure 7:
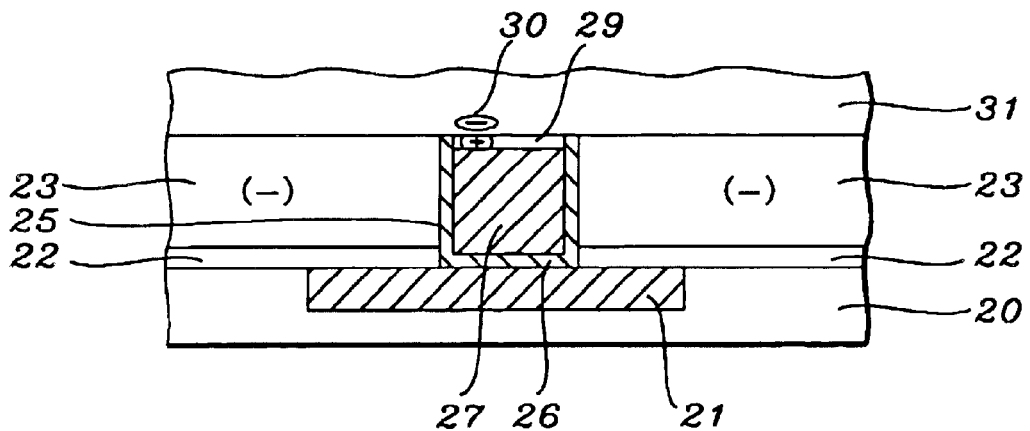
FIG. 7 is a cross-sectional view of a copper interconnect during a DI water polish step in an oxide buffing process and indicates a possible mechanism whereby a negative charge on a particle is attracted to a positively charged copper oxide layer.

One possible mechanism that explains the reason for the reduced defect count by employing the method of the present invention is depicted in FIGS. 6 and 7. In FIG. 6, an oxide slurry 28 is applied to the dielectric layer 23 and twice polished copper layer 27 as in step A or step 1 mentioned previously. As a result of exposure to the oxide slurry 28 with a pH of about 9.1, the top portion of the twice polished copper layer 27 is oxidized to form a thin copper oxide layer 29. Those skilled in the art will recognize that the thickness of the copper oxide layer 29 is exaggerated in the drawing for illustrative purposes and in an actual oxide polishing process the layer may only be a few Angstroms thick. A negative charge develops on the copper oxide layer 29 and on the surface of dielectric layer 23 which repulses the negatively charged particles or residue 30. Note that the terms particle and residue may be used interchangeably hereafter. During step B or step 2 of the oxide polish process as represented by FIG. 7, a DI water layer 31 with pH 7 is applied to the surface of the dielectric layer 23 and copper oxide layer 29. Negatively charge particles 30 remaining from the previous step are attracted to copper oxide layer 29 which is now positively charged. Further water rinsing as in steps C and D may not be able to dislodge particle 30 and it remains as a defect in the prior art method. However, when a DI water rinse as shown in FIG. 7 is followed by a second oxide slurry and then a short DI water rinse with a low down force according to steps 3–5 of the present invention, then a majority of the particles 30 are removed.

It is believed that another mechanism may play an important role in reducing defect count in the oxide polish process of the present invention. At the beginning of the oxide polish process, the surface of the dielectric layer 23 and twice polished copper layer 27 may have a residual passivating agent from a slurry used to polish a TaN diffusion barrier layer in the previous CMP process. When combined with the passivating agent which is BTA or a BTA-like additive in the oxide slurry, the total passivating agent concentration may saturate the slurry and some BTA may precipitate on the surface of the dielectric layer 23 and on twice polished copper layer 27. The passivating agent is generally a polar compound and may be difficult to remove from the surface of a charged layer. Although passivating agents do not dissolve well in DI water, the second oxide polish step in the present invention is able to lower the passivating agent's concentration enough to allow the passivating agent to be redissolved and thus removed in a subsequent DI rinse step 5.

Still another mechanism may have an effect on the number of particle defects produced during the oxide polish process when TaN is the diffusion barrier layer. It is believed that during the first step of the oxide polish process there are TaN slurry residues which react with the oxide slurry to form a complex. A DI water rinse without abrasives is not capable of removing the complex which becomes a residue defect but a second oxide slurry application that does contain abrasives is able to polish away the complex and reduce the total defect count.

Figure 8:
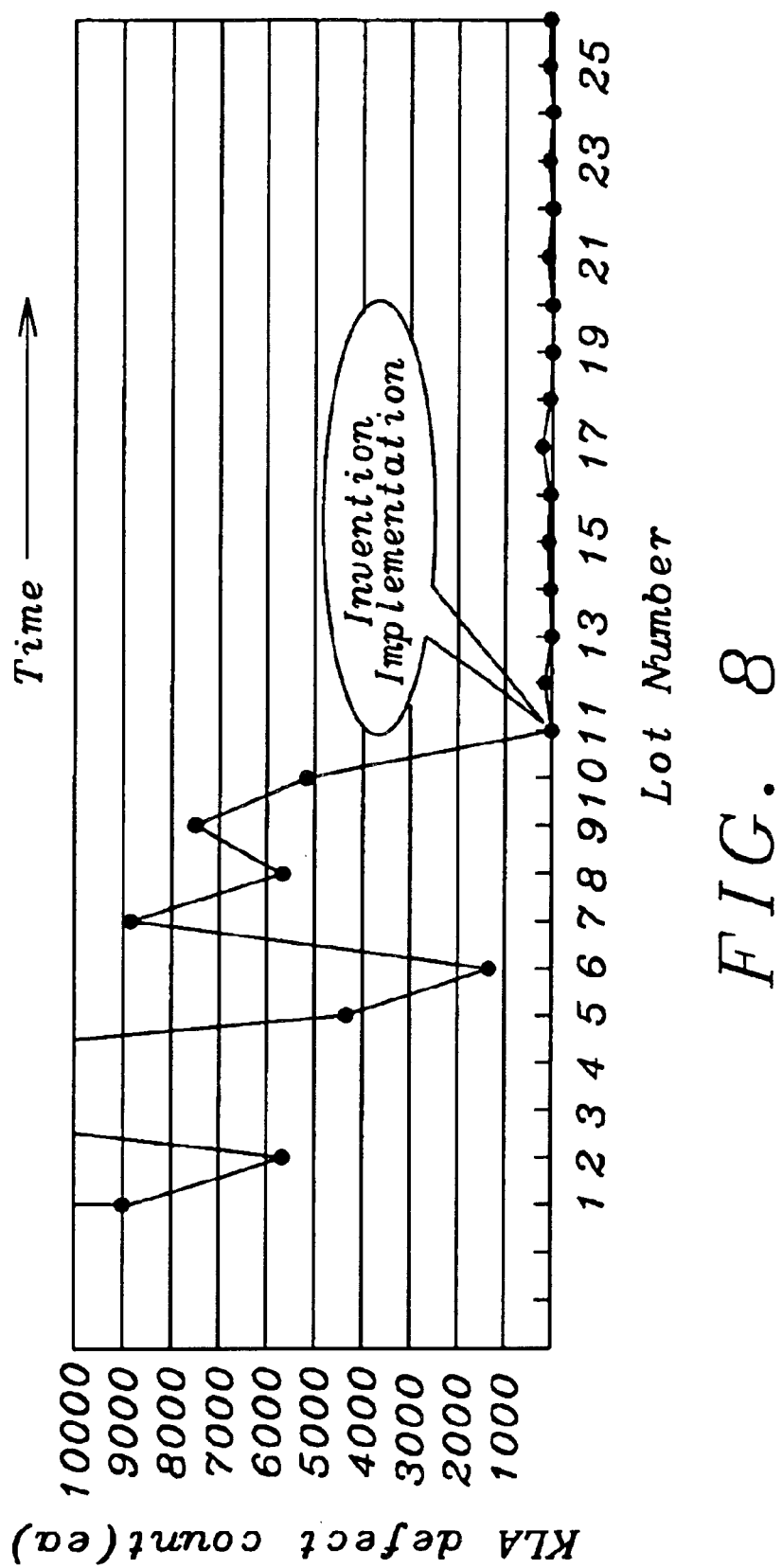
FIG. 8 is a copper CMP defect trend chart showing defect count vs. lot number that indicates a significant defect reduction after a method of the present invention was implemented in manufacturing.

Referring to FIG. 8, the advantage of the present invention is illustrated in a trend chart of defect count vs. lot number in which lots 1 through 10 were polished using a prior art oxide polish process and lots 11 through 26 were polished with the oxide polish process of the present invention. While the defect count is above 1000 and typically several thousand for the prior art method, the defects are reduced to below 1000 and to fewer than 100 in most lots after the invention was implemented.

Those skilled in the art will appreciate that the previously described damascene process including the oxide polishing process of the present invention may be performed a plurality of times on a substrate to fabricate a plurality of copper layers that form a stacked copper structure.

The present invention also anticipates that the oxide polish process may be integrated into an advanced process control (APC) system such as the one described in detail in a related patent application TSMC02-0992. This option is especially useful if wafer to wafer variation in dielectric layer thickness or in copper layer width and/or thickness is large enough to prevent an oxide polish process with a fixed polish time from producing an acceptable Rs value for a copper layer on each wafer. In this case, the thickness of the copper and dielectric layers removed from a wafer during a previous oxide polish process is supplied to a feed backward model in a computer linked to an APC controller which in turn communicates information and data to the tool control system (TCS) for the CMP tool. The computer also contains a program with a feed forward model where metrology data relating to copper layer thickness and width, for example, and a Rs target value for each wafer to be polished is used to calculate a polish time for each wafer sent to the oxide polish process. The polish time for each wafer is adjusted upward or downward in real time from a starting recipe as represented in Table 2 depending on the drift in the oxide buffing rate on a previous wafer so that an Rs value for the resulting interconnect can be maintained within specified limits.

In one aspect, the oxide polish process is controlled by an APC system in which one or more of steps 1 to 5 in Table 2 may be modified by adjusting the duration of the step and other parameters such as down force or flow rate of the oxide slurry in order to compensate for a drift in the oxide polish rate. Those skilled in the art will recognize that the relationship between Rs and various parameters in the oxide polish process may be determined by processing an experimental lot of substrates and then programming the results into the computer in the APC system that manages the feed forward and feed backward calculations. Therefore, an appropriate recipe may be determined for each substrate in a series of substrates to be polished in the oxide polish process so that an acceptable Rs value is achieved for the resulting copper interconnect.

The benefits of this embodiment are the same as for the first embodiment where the oxide polish recipe has a fixed process time for each step since the most important feature of this invention is that a first oxide slurry and DI rinse sequence is followed by a second oxide slurry and DI rinse sequence during the oxide polish process. In other words, the duration for each step and other parameters in the first and second sequences are important, but those skilled in the art will recognize that the duration and other parameters for each step may be changed somewhat without compromising any advantages gained by practicing the process of the present invention.

While this invention has been particularly shown and described with reference to, the preferred embodiments thereof, it will be understood by those skilled in the art that various changes in form and details may be made without departing from the spirit and scope of this invention.

What is claimed is:
1. An oxide polishing process comprising:
   (a) providing a substrate having a top surface comprised of a copper layer area and a dielectric layer area;
   (b) performing a first oxide polishing step at a first polish station in a polishing tool by using a polishing pad and a slurry on a platen to contact the top surface of said substrate;
   (c) rinsing the substrate with DI water;
   (d) performing a second oxide polishing step at said first polish station by using said polishing pad and a slurry; and
   (e) rinsing the substrate a second time with DI water.
2. The method of claim 1 wherein the top surface has been polished in one or more previous CMP processes.
3. The method of claim 1 wherein said first oxide polish step and said second oxide polishing step are performed in a CMP tool with a slurry comprised of silica, water, and one or more additives that has a pH of about 7 to 10.
4. The method of claim 1 wherein the top surface of said substrate is further comprised of a diffusion barrier layer area that includes one or more of TaN, Ta, Ti, TiN, WN, W, TaSiN, and/or TiSiN and is formed between said copper layer area and said dielectric layer area.
5. The method of claim 1 wherein said first oxide polishing step and said second oxide polishing step are performed at a temperature in the range of about 20° C. to 30° C. and with a platen rotational speed of about 40 to 70 rpm.
6. The method of claim 1 wherein said rinsing the substrate with DI water is performed with a DI water flow rate of about 500 ml/min. for a period of about 10 seconds and is comprised of a down force of about 1 psi.
7. The method of claim 1 further comprising:
   a polishing pad priming step between steps (c) and (d) comprised of a DI water flow rate of about 500 to 1000 ml/min. and a flow rate of an oxide slurry of about 200 to 300 ml/minute for a period of about 10 seconds while a polishing head is raised above a polishing pad so that the top surface of the substrate does not make contact with said polishing pad.
8. The method of claim 1 wherein said second oxide polishing step comprises an oxide slurry flow rate of about 300 ml/minute and a down force of about 1 psi for a period of about 15 seconds.
9. The method of claim 1 wherein said rinsing the substrate a second time with DI water comprises a DI water flow rate of about 500 to 1000 ml/min., a down force of about 1 psi, and a rotational speed of about 40 rpm for a period of about 20 seconds.
10. A chemical mechanical polish (CMP) flow sequence for polishing a substrate with a top and bottom surface during the fabrication of a copper interconnect, comprising:
   (a) providing a substrate having an opening with a top, bottom, and sidewalls formed therein, said opening is filled with a conformal diffusion barrier layer on the sidewalls and bottom of the opening and a copper layer on said diffusion barrier layers wherein said diffusion barrier layer and copper layer extend above the top of said opening and the top surface of the substrate is comprised of a copper layer area at the top of the copper layer to be polished;
   (b) performing a first CMP process at a first polish station using a polishing pad and a slurry on a platen to remove a portion of the copper layer so that the polished copper layer becomes coplanar with said diffusion barrier layer, said substrate is held by its bottom surface on a head that has a down force and a rotational speed;

(c) performing a second CMP process at a second polish station using a polishing pad and a slurry on a platen to remove a portion of the diffusion barrier layer and a portion of the polished copper layer so that the polished diffusion barrier layer and the twice polished copper layer become coplanar with the top of the opening, said substrate is held by its bottom surface on a head that has a down force and rotational speed; and (d) performing a third CMP process which is an oxide polishing process at a third polishing station using a slurry and a polishing pad on a platen to form a smoother top surface comprised of a diffusion barrier area at the top of the polished diffusion barrier layer and a copper layer area at the top of the twice polished copper layer, and to remove residues from previous CMP processes, said substrate is held by a head that has a down force and a rotational speed and wherein said third CMP process comprises:

(1) performing a first oxide polishing step
(2) rinsing the substrate with DI water;
(3) performing a second oxide polishing step; and
(4) rinsing the substrate a second time with DI water.

11. The method of claim 10 wherein said first oxide polishing step and aid second oxide polishing step are performed in a CMP tool with a slurry that has a pH of about 7 to 10 and is comprised of silica, water, and one or more additives.

12. The method of claim 10 wherein said first oxide polishing step and said second oxide polishing step are performed at a temperature in the range of about 20° to 30° C. with a platen rotational speed of about 40 to 70 rpm.

13. The method of claim 10 wherein said first oxide polishing step comprises a down force of about 2 psi and an oxide slurry flow rate of about 300 ml/minute for a period of about 20 seconds.

14. The method of claim 10 wherein said rinsing the substrate with DI water is performed with a DI water flow rate of about 500 ml/min. for a period of about 10 seconds and is comprised of a down force of about 1 psi.

15. The method of claim 10 further comprised of a polishing pad priming step at the third polishing station after step (2) and before step (3) comprised of a DI water flow rate of about 500 to 1000 ml/mi. and a flow rate of an oxide slurry of about 200 to 300 ml/min. for a period of about 10 seconds while the head is raised above the polishing pad so that the top surface of said substrate does not make contact with said polishing pad.

16. The method of claim 10 wherein said second oxide polishing step comprises an oxide slurry flow rate of about 300 ml/min. and a down force of about 1 psi for a period of about 15 seconds.

17. The method of claim 10 wherein said rinsing the substrate a second time with DI water comprises a DI water flow rate of about 500 to 1000 ml/min., a down force of about 1 psi, and a rotational speed of about 40 rpm for a period of about 20 seconds.

18. The method of claim 10 wherein the first CMP process, second CMP process, and third CMP process are performed in the same CMP tool which is integrated with a spin-rinse dryer module to dry the substrate.

19. The method of claim 10 wherein the CMP flow sequence is implemented as part of a damascene process and the damascene process is performed a plurality of times on a substrate to fabricate a plurality of copper layers that form a stacked copper structure.

20. A method for chemical mechanical polishing (CMP) a semiconductor substrate with one or more exposed copper areas and one or more exposed oxide layers on a top surface of the substrate, the method comprising:

performing a first polishing operation on the exposed oxide layer using a first slurry;

performing a first rinsing operation of the top surface of the substrate;

performing a second polishing operation on the exposed oxide layer using a second slurry; and performing a second rinsing operation of the top surface of the substrate.

21. The method of claim 20 wherein the steps are performed on a first head and platen of a CMP system.

22. The method of claim 21 further comprising:

performing a third polishing operation on the exposed copper area with a third slurry on a second head and platen of the CMP system prior to the first and second polishing operations.

23. The method of claim 22, wherein the semiconductor substrate includes an exposed barrier layer after the polishing of the exposed copper area, the method further comprising:

performing a fourth polishing operation on the exposed barrier layer with a fourth slurry on a fourth head and platen of the CMP system prior to the first and second polishing operations and after the third polishing operation.

24. The method of claim 20 wherein the first and second slurries are the same.

* * * * *